(12) United States Patent
Murthy et al.

(10) Patent No.: US 8,642,413 B2
(45) Date of Patent: Feb. 4, 2014

(54) FORMATION OF STRAIN-INDUCING FILMS USING HYDROGENATED AMORPHOUS SILICON

(75) Inventors: Anand S. Murthy, Portland, OR (US); Jeffrey L. Armstrong, Beaverton, OR (US); Dennis G. Hanken, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 1417 days.

(21) Appl. No.: 11/521,850

(22) Filed: Sep. 14, 2006

(65) Prior Publication Data

US 2008/0070384 A1    Mar. 20, 2008

(51) Int. Cl.
*H01L 21/336* (2006.01)

(52) U.S. Cl.
USPC ............... 438/197; 257/18; 257/E29.193

(58) Field of Classification Search
USPC ....... 438/482, 197; 257/18–19, 338, E29.193
See application file for complete search history.

(56) References Cited

U.S. PATENT DOCUMENTS

| | | | |
|---|---|---|---|
| 5,266,825 A | 11/1993 | Tsukada et al. | |
| 5,744,817 A | 4/1998 | Shannon | |
| 5,773,329 A | 6/1998 | Kuo | |
| 6,960,781 B2 | 11/2005 | Currie et al. | |
| 2006/0131665 A1 | 6/2006 | Murthy | |
| 2006/0134872 A1 | 6/2006 | Hattendorf | |
| 2006/0148151 A1 | 7/2006 | Murthy | |
| 2008/0014688 A1* | 1/2008 | Thean et al. | ............. 438/197 |

OTHER PUBLICATIONS

U.S. Appl. No. 10/993,865, filed Nov. 18, 2004, Murthy.
U.S. Appl. No. 11/386,518, filed Mar. 21, 2006, Liu.
U.S. Appl. No. 11/387,012, filed Mar. 21, 2006, Rachmady.
PCT Search Report and Written Opinion from PCT/US2007/078579 mailed Jan. 30, 2008, 10 pgs.
International Preliminary Report on Patentability from PCT/US2007/078579 mailed Mar. 26, 2009, 6 pgs.

* cited by examiner

*Primary Examiner* — Tony Tran
(74) *Attorney, Agent, or Firm* — Blakely, Sokoloff, Taylor & Zafman LLP

(57) ABSTRACT

A method to form a strain-inducing epitaxial film is described. In one embodiment, the strain-inducing epitaxial film is a three-component epitaxial film comprising atoms from a parent film, charge-neutral lattice-substitution atoms and charge-carrier dopant impurity atoms. In another embodiment, the strain-inducing epitaxial film is formed by a multiple deposition/etch cycle sequence involving hydrogenated amorphous silicon, followed by charge carrier dopant and charge-neutral lattice-forming impurity atom implant steps and, finally, a kinetically-driven crystallization process.

16 Claims, 11 Drawing Sheets

FORMATION OF STRAIN-INDUCING FILMS USING HYDROGENATED AMORPHOUS SILICON

BACKGROUND OF THE INVENTION

1) Field of the Invention

The invention is in the field of Semiconductor Devices.

2) Description of Related Art

For the past several years, the performance of semiconductor devices, such as Metal Oxide Semiconductor Field-Effect Transistors (MOS-FETs), has been greatly enhanced by the incorporation of strained silicon regions into the active portions of a semiconductor substrate, e.g. the use of compressively strained silicon channel regions to enhance hole mobility in P-type Metal Oxide Semiconductor Field-Effect Transistors (PMOS-FETs). The presence of such strained silicon regions may greatly enhance the rate at which charge migrates in a channel when a semiconductor is in an ON state.

FIG. 1 depicts a typical strained PMOS-FET 100 fabricated on a substrate 102. A gate dielectric layer 104 sits above a channel region 106 and a gate electrode 108 sits above gate dielectric layer 104. Gate dielectric layer 104 and gate electrode 108 are isolated by gate isolation spacers 110. Tip extensions 112 are formed by implanting dopant atoms into substrate 102. Strain-inducing source/drain regions 120 are formed by selectively growing an epitaxial film in etched-out portions of substrate 102 and are doped either in situ or after epitaxial film growth, or both. Strain-inducing source/drain regions are comprised of a material with a larger lattice constant than that of the channel region 106. In typical PMOS-FETs, the channel region 106 is comprised of crystalline silicon, while the strain-inducing source/drain regions 120 are comprised of epitaxial silicon/germanium which has a larger lattice constant than that of crystalline silicon. Strain-inducing source/drain regions 120 can invoke a uniaxial compressive strain on the channel region 106. Such a compressive strain in the channel region 106 can enhance the hole mobility in the channel region 106 of PMOS-FET 100, lending to improved performance of the device.

FIGS. 2A-C illustrate a typical process flow for forming strain-inducing source/drain regions in a PMOS-FET. Referring to FIG. 2A, a non-strained PMOS-FET 200 is first formed. Non-strained PMOS-FET 200 is comprised of a channel region 206. A gate dielectric layer 204 sits above channel region 206 and a gate electrode 208 sits above gate dielectric layer 204. Gate dielectric layer 204 and gate electrode 208 are isolated by gate isolation spacer 210. Tip extensions 212 and source/drain regions 214 are formed by implanting dopant atoms into substrate 202. Thus, the source/drain regions 214 are initially formed from the same material as the channel region 206. Therefore, the lattice mismatch between the source/drain regions 214 and the channel region 206 is negligible, resulting in effectively no strain on the channel region 206.

Referring to FIG. 2B, portions of substrate 202, including source/drain regions 214, are removed, e.g. by an etch process, to form recessed regions 216 in substrate 202. Subsequently, strain-inducing source/drain regions 220 are formed by selectively growing an epitaxial film into recessed regions 216, as depicted in FIG. 2C. Strain-inducing source/drain regions 220 can be doped with charge-carrier atoms, e.g. boron in the case of a PMOS-FET, which may be carried out in situ or after epitaxial film growth, or both. In an example, substrate 202, and hence channel region 206, is comprised of crystalline silicon and the film grown to form strain-inducing source/drain regions 220 is comprised of epitaxial silicon/germanium. The lattice constant of the epitaxial silicon/germanium film can be greater than that of crystalline silicon by a factor of ~1% (for 70% Si, 30% Ge) and so strain-inducing source/drain regions 220 are comprised of a material with a larger lattice constant than that of channel region 206. Therefore, a uniaxial compressive strain, depicted by the arrows in FIG. 2C, is rendered on channel region 206 in PMOS-FET 230, which can enhance hole mobility in the device.

In order to improve performance in N-type Metal Oxide Semiconductor Field-Effect Transistors (NMOS-FETs), a uniaxial tensile strain may be required to enhance electron mobility in the channel region. This may require incorporation of strain-inducing source/drain regions with a smaller lattice constant than that of the channel region. For example, epitaxial carbon-doped silicon source/drain regions may be desirable for NMOS-FETs with a crystalline silicon channel region because the lattice constant of epitaxial carbon-doped silicon is smaller than that of crystalline silicon. However, selective deposition of an epitaxial carbon-doped silicon film with phosphorus dopant impurity atoms can be difficult. Furthermore, subsequent incorporation of N-type dopants, e.g. phosphorus, into such an epitaxial carbon-doped silicon film may modify the film by displacing the lattice-incorporated carbon atoms. Such displacement of lattice-incorporated carbon atoms can reduce the lattice constant differential between the resulting source/drain regions and the channel region, effectively mitigating any performance-enhancing strain induced on the channel region. Thus, a method to fabricate an N-type epitaxial carbon-doped silicon film is described herein.

DETAILED DESCRIPTION

Figure 1:
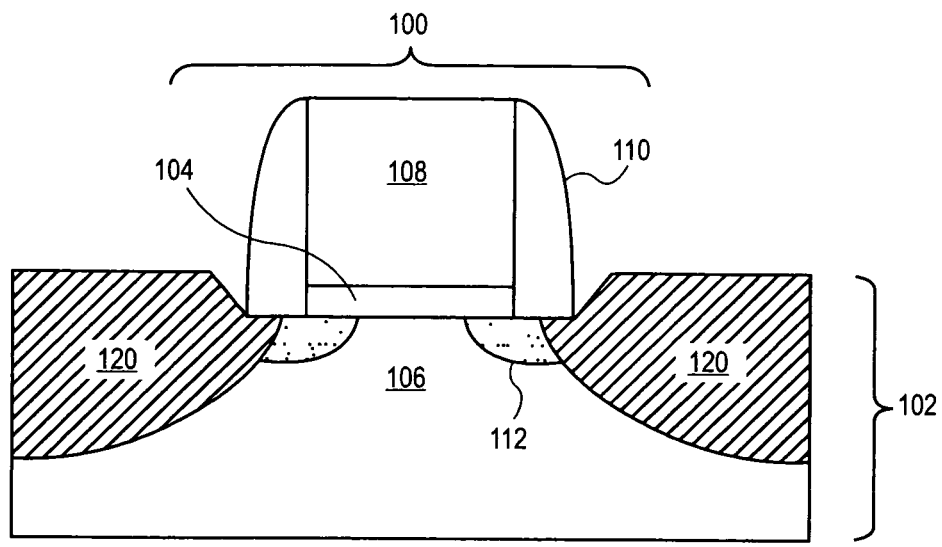
FIG. 1 illustrates a cross-sectional view of a strained P-type Metal Oxide Semiconductor Field-Effect Transistor (PMOS-FET), in accordance with the prior art.
Figure 2A:
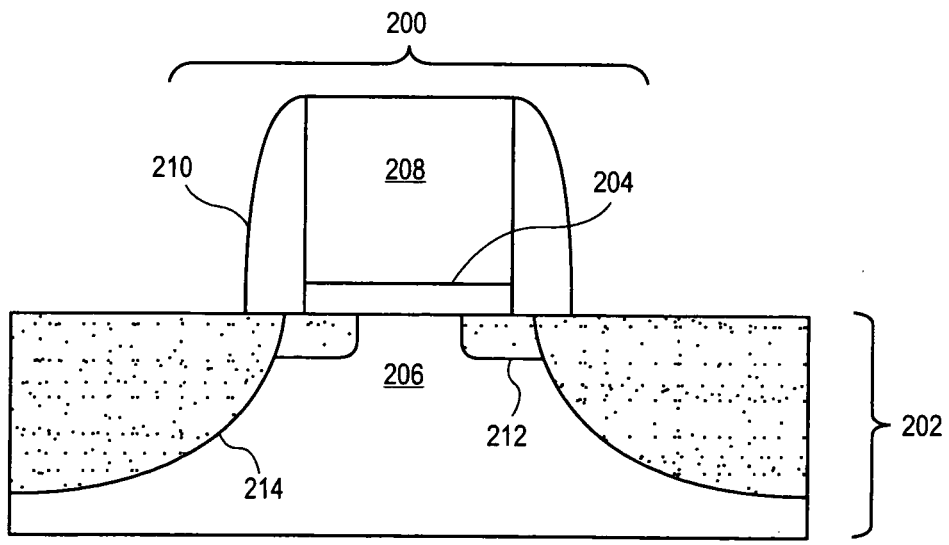
FIGS. 2A-C illustrate cross-sectional views representing the formation of a PMOS-FET with strain-inducing source/drain regions, in accordance with the prior art.
Figure 2B:
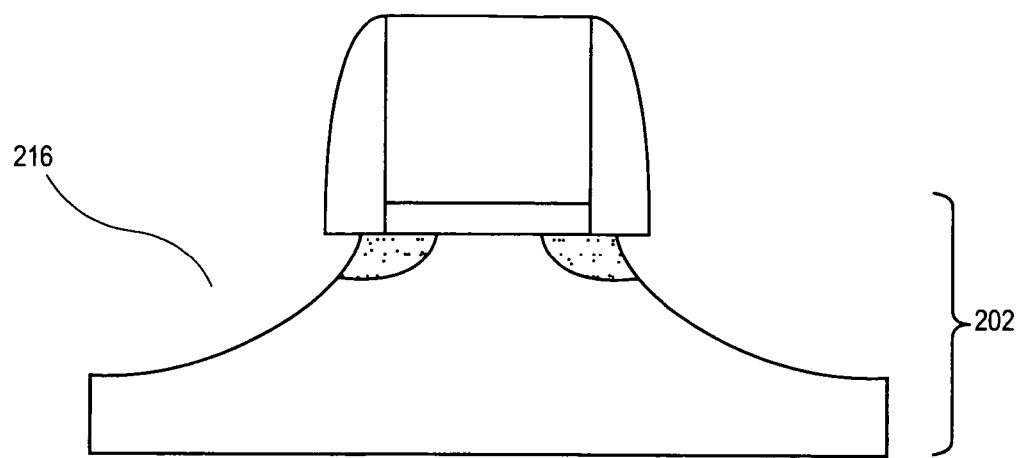
Figure 2C:
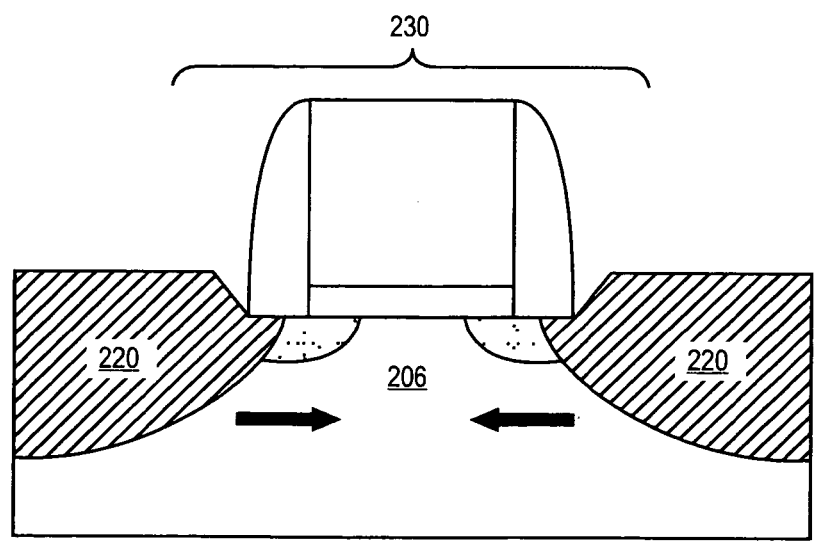

A process for fabricating semiconductor devices and the resultant devices are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as patterning steps or wet chemical cleans, are not described in detail in order to not unnecessarily obscure the present invention. Furthermore, it is understood that the various embodiments shown in the figures are illustrative representations and are not necessarily drawn to scale.

Disclosed herein is a method to form a strain-inducing epitaxial film. Formation of the strain-inducing epitaxial film by a multiple deposition/etch cycle sequence involving an hydrogenated amorphous silicon film, followed by charge-carrier dopant and charge-neutral lattice-forming impurity atom implant steps and, finally, a kinetically-driven crystallization process may enable a much higher strain and doping activation in the epitaxial film than can be achieved by other methods. For example, an epitaxial carbon-doped silicon film fabricated in this way can incorporate a substantial amount of phosphorus as an N-type dopant while maintaining a significant amount of carbon atoms substituted in the silicon lattice. The lattice constant of the epitaxial N-type carbon-doped silicon film may be smaller than the lattice constant of an adjacent crystalline silicon region, resulting in a tensile strain induced in the silicon region and in the N-type carbon-doped silicon film. An NMOS-FET with source/drain regions comprised of such an epitaxial N-type carbon-doped silicon film and a channel region comprised of crystalline silicon may have an enhanced electron mobility in the channel region when the NMOS-FET is in an ON state.

A deposition sequence of multiple deposition/etch cycles involving hydrogenated amorphous silicon may be used to ultimately form an epitaxial silicon film in a selective manner. The hydrogenated amorphous silicon film can contain a significant amount of terminal hydrogen atoms (~1 hydrogen atom per silicon atom, on average; however films with an H:Si atomic ratio in the range of $1\times10^{-6}$-3:1 are considered to be within the scope of the present invention) and thus provides a low polarity surface onto which low polarity films may be deposited. Additionally, the deposition of hydrogenated amorphous silicon is favored on a low polarity substrate surface (such as a silicon or Si—H surface) versus on a highly polar dielectric surface (such as the surface of a silicon dioxide or a silicon nitride film). The hydrogenated amorphous silicon surface is a low polarity surface when grown directly above a substrate surface and hence favors further growth of hydrogenated amorphous silicon. Thus, in accordance with an embodiment of the present invention, over the duration of a single deposition step, the portion of a hydrogenated amorphous silicon film that is grown above a low polarity surface (e.g. a silicon substrate surface) is substantially thicker than the portion grown above a neighboring highly polar dielectric surface.

A carefully calibrated etch process may then be utilized to remove a portion of the deposited hydrogenated amorphous film with a thickness that is equivalent to, or slightly greater than, the thickness of the portion above the highly polar dielectric region. Thus, in accordance with an embodiment of the present invention, the portion of the deposited hydrogenated amorphous silicon film that is deposited above a highly polar dielectric region is totally removed with an etch process, leaving only the portion of the hydrogenated amorphous silicon film that remains above a low polarity surface, such as a silicon substrate surface. Understandably, the portions of the film that remain are thinner than as deposited (a result of the etch being non-selective), but a significant portion of the film can be retained above the low polarity regions nonetheless. The above deposition/etch cycle may then be repeated multiple times to provide a hydrogenated amorphous silicon film with a desired thickness. In accordance with an embodiment of the present invention, a multiple deposition/etch cycle sequence is used to provide a hydrogenated amorphous silicon film of a desired thickness that resides on regions with surfaces of low polarity, but not on high polarity dielectric regions. Thus, by selecting an appropriate number of deposition/etch cycles, an epitaxial film may be formed selectively (i.e. restricted to desired locations) at a desired thickness.

Charge-carrier dopant impurity atoms, e.g. phosphorus or boron atoms, may be implanted into a crystalline substrate or an epitaxial film, e.g. a substrate or film comprised of silicon and/or germanium. Such an implant process may be optimal in an amorphous film, in that a higher concentration of dopant impurity atoms may be implanted into the amorphous film as compared with, say, a monocrystalline film. In accordance with an embodiment of the present invention, charge-carrier dopant impurity atoms are implanted into an amorphous film at a concentration of greater than 1E20 atoms/cm$^3$. In one embodiment, phosphorous dopant impurity atoms are implanted into a hydrogenated amorphous silicon film at a concentration greater than 2E20 atoms/cm$^3$. A higher concentration of dopant impurity atoms may reduce parasitic resistance in a semiconductor region. Thus, in an embodiment, a process comprising implanting a high concentration of phosphorus atoms into a hydrogenated amorphous silicon film is ultimately used to form a low-resistivity semiconductor region.

Charge-neutral lattice-forming impurity atoms may be used to modify the lattice constant of a semiconductor film, e.g. C atoms may be used to shrink the lattice of a crystalline silicon film. Such impurity atoms can be implanted into an amorphous semiconductor film and the implanted amorphous semiconductor film can subsequently be crystallized to provide an epitaxial semiconductor film that incorporates substitutional lattice-forming impurity atoms into its lattice structure. Thus, the charge-neutral lattice-forming atoms can play a role in dictating the lattice constant (i.e. size) of the crystallized semiconductor film. As with the charge-carrier dopant impurity atoms, such an implant process may be optimal in an initially amorphous film, in that a higher concentration of lattice-forming impurity atoms may be implanted into the amorphous film than, say, a monocrystalline film.

The semiconductor film including charge-neutral lattice-forming impurity atoms may be used as a strain-inducing region in a semiconductor structure. A strain-inducing semiconductor region formed in an etched-out portion of a crystalline substrate may impart a uniaxial strain to the crystalline substrate. In turn, the crystalline substrate may impart a uniaxial strain to the strain-inducing semiconductor region. For example, in accordance with an embodiment of the present invention, a MOS-FET device comprises strain-inducing source/drain regions formed in etched-out portions of a crystalline substrate. The strain-inducing source/drain regions may impart a uniaxial strain to the crystalline substrate, while the crystalline substrate imparts a uniaxial strain to the strain-inducing source/drain regions. In one embodiment, the lattice constant of the strain-inducing source/drain regions is smaller than the lattice constant of the crystalline substrate and the strain-inducing source/drain regions impart a tensile uniaxial strain to the crystalline substrate, while the crystalline substrate imparts a tensile strain to the strain-inducing source/drain regions. Thus, when the lattice constant of a strain-inducing source/drain region that fills an etched-out portion of a crystalline substrate is smaller than the lattice constant of the crystalline substrate, the lattice-forming atoms of the strain-inducing source/drain region are pulled apart (i.e. tensile strain) from their normal resting state and hence may induce a tensile strain on the crystalline substrate as they attempt to relax. A higher concentration of lattice-forming impurity atoms may increase the amount of strain induced by a lattice-forming impurity atom-doped epitaxial film on an adjacent crystalline region. Thus, in an embodiment, a process comprising implanting a high concentration of carbon atoms into a hydrogenated amorphous silicon film is ultimately used to form a highly strained semiconductor region.

Figure 3:
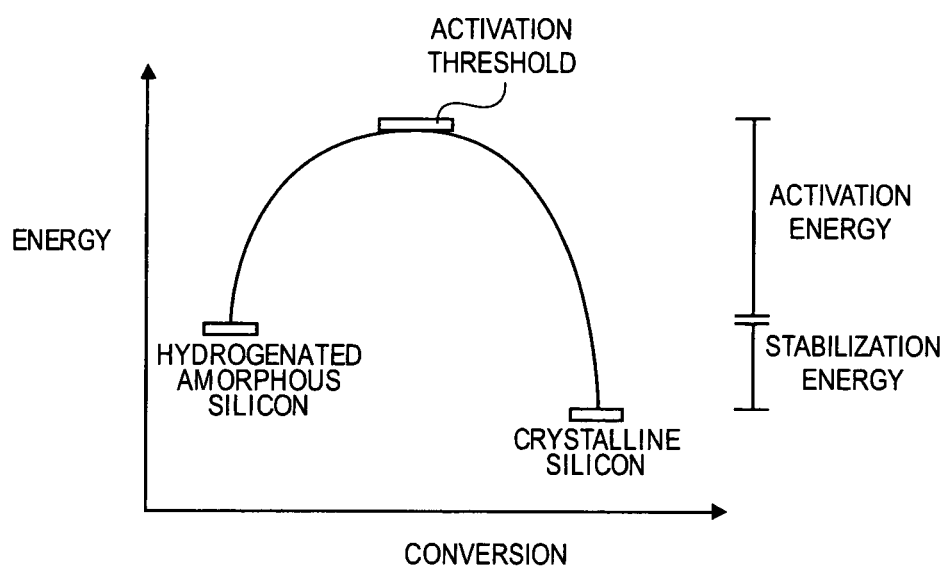
FIG. 3 illustrates an energy/conversion representation of the energy states of hydrogenated amorphous silicon versus crystalline silicon, in accordance with an embodiment of the present invention.

For many semiconductor device applications, it may be necessary that an amorphous film incorporating both charge-carrier dopant and charge-neutral lattice-forming impurity atoms exist in a crystalline form. Kinetically-driven crystallization is a method in which a material is heated above the activation threshold, quickly caused to reorganize on an atomic level, and subsequently cooled. The new solid phase formed may be a crystallized phase, such as a single-crystal phase, that is thermodynamically more stable than the starting phase. Because the reorganization is caused to occur quickly, the new solid phase formed may not be the thermodynamically most stable solid phase, so it is thus referred to as the kinetic solid phase product. In effect, a local energy minima may be achieved for the crystallized solid phase, but the local energy minima may not indeed be the global energy minima for all phases of the crystallized solid phase. The energy state of the crystalline phase for a given film is often more stable than that of the corresponding amorphous phase, such that conversion from the latter to the former is practically irreversible. As an example, FIG. 3 illustrates an energy/conversion representation of the energy states of hydrogenated amorphous silicon versus crystalline silicon. The thermodynamic energy state of the crystallized silicon film is more stable (lower in total energy) than the corresponding thermodynamic energy state of the amorphous film (higher in energy). The difference in energy between the two states is the stabilization energy, resulting from the conversion from an amorphous state to a crystalline state. Referring to FIG. 3, the activation threshold must be surpassed to invoke the conversion from amorphous state to crystalline state. The activation threshold represents the minimum energy required to be imparted to the amorphous state in order for the conversion to the crystalline state to occur. Thus, the requisite activation energy must be provided to the overall system to enable the atomic reorganization, forming a more stable film. Thus, in accordance with an embodiment of the present invention, a hydrogenated amorphous silicon film deposited selectively on low polarity regions of a substrate by a multiple deposition/etch cycle process and incorporating both charge-carrier dopant and charge-neutral lattice-forming impurity atoms is crystallized by a kinetically-driven crystallization process. The requisite activation energy may be provided in the form of a thermal anneal process, such as a laser or a flash anneal process.

Upon cooling, the hydrogenated amorphous silicon film grown selectively on low polarity regions of a substrate by a multiple deposition/etch cycle sequence and incorporating both charge-carrier dopant and charge-neutral lattice-forming impurity atoms may form an epitaxial film which incorporates both impurity types into its lattice. Thus, a selectively grown three-component epitaxial system may be formed. For example, in accordance with an embodiment of the present invention, a three-component epitaxial film containing charge-neutral lattice-substitution atoms (e.g. carbon atoms in silicon) and charge-carrier dopant impurity atoms (e.g. phosphorus atoms in silicon) is formed. In another embodiment, an epitaxial silicon film containing carbon lattice-substitution atoms (i.e. a carbon-doped epitaxial silicon film) and phosphorus charge-carrier dopant impurities is formed in an etched-out region of a crystalline silicon substrate. In one embodiment, the concentration of lattice-substituting carbon atoms in a silicon epitaxial film (comprised of 97-99.5% Si atoms) is in the range of 0.5%-3% of the total film atomic composition. In another embodiment, the concentration of the phosphorus charge-carrier dopant impurities in a silicon-based epitaxial film (comprised of 97-99.5% Si atoms) is greater than $2E20$ atoms/cm$^3$. In one embodiment, the concentration of lattice-substituting carbon atoms in a silicon epitaxial film is about 1% of the total film atomic composition and the concentration of the phosphorus charge-carrier dopant impurities is in the range of $2E19$-$2E21$ atoms/cm$^3$. In another embodiment, the lattice constant of the epitaxial film is smaller than the lattice constant for crystalline silicon by a factor in the range of 0.1%-1.0%. Thus, a tensile strain may be induced on a silicon substrate that incorporates such an epitaxial carbon-doped silicon film with phosphorus dopant impurities.

Figure 4A:
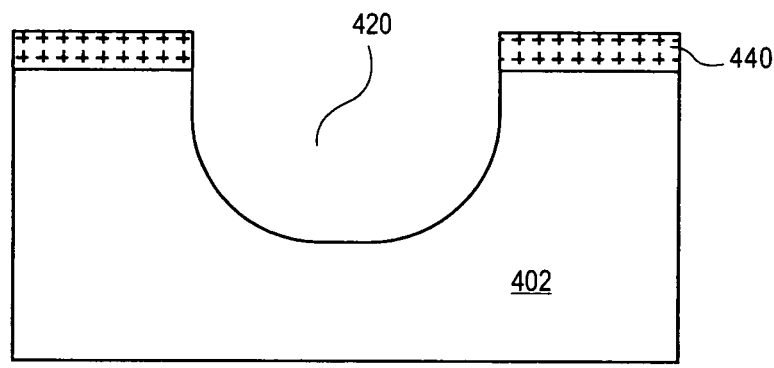
FIGS. 4A-I illustrate cross-sectional views representing the formation of an epitaxial film in an etched-out region of a crystalline substrate, in accordance with an embodiment of the present invention.

As an example of one embodiment of the present invention, FIGS. 4A-I illustrate the formation of a strain-inducing epitaxial film in an etched out region of a crystalline substrate (i.e. the "host" material). A multiple deposition/etch cycle sequence involving a hydrogenated amorphous silicon film, followed by charge-carrier dopant and charge-neutral lattice-forming impurity atom implant steps and, finally, a kinetically-driven crystallization process is illustrated. Referring to FIG. 4A, a region of low polarity crystalline substrate 402 between highly polar dielectric regions 440 may be removed to form etched-out region 420. Low polarity crystalline substrate 402 may be formed from any material that provides a low polarity surface on its top surface and/or on the surface of an etched-out portion of the substrate. In one embodiment, crystalline substrate 402 is a crystalline silicon substrate, a doped crystalline silicon substrate, or an epitaxial silicon layer grown atop a distinct boron-doped crystalline silicon substrate. In another embodiment, crystalline substrate 402 is comprised of germanium or a III-V material such as but not limited to gallium nitride, gallium phosphide, gallium arsenide, indium phosphide or indium antimonide. The bottom surface of etched-out region 420 may be a low polarity surface. A low polarity surface comprises atomic interactions of substantially similar polarity. In accordance with an embodiment of the present invention, the deposition of a low polarity film, such as a film of hydrogenated amorphous silicon, is more favored on low polarity surfaces versus high polarity surfaces. For example, in one embodiment, as calculated using the difference of Pauling's values for electronegativity for each atom type (N. N. Greenwood and A. Earnshaw, *Chemistry of the Elements*, 2$^{nd}$ Ed., Reed Educational and Professional Publishing Ltd, 1997, p. 26), the polarity of the surface atomic interactions is in the range of 0-0.5 (for example: where H is 2.1 and Si or Ge are 1.8, an Si—H or Ge—H bond has a value of ~0.3 and Si—Si, Ge—Ge or Ge—Si bonds have a value of ~0; or where an In—Sb bond has a value of ~0.25).

The highly polar dielectric region 440 comprises atomic interactions of substantially different polarity. For example, the highly polar dielectric region 440 may be comprised of any dielectric material where the surface atomic interactions have a difference of Pauling's values greater than 1. In one embodiment, highly polar dielectric region 440 is comprised of silicon dioxide (where Pauling's value for electronegativity for Si is 1.8 and for O is 3.5, and thus an Si—O bond has a value of ~1.7), silicon nitride (where Pauling's value for electronegativity for Si is 1.8 and for N is 3, and thus an Si—N bond has a value of ~1.2), silicon oxy-nitride, carbon-doped silicon oxide or nitride, or a high-K dielectric layer.

Etched-out region 420 may be formed by any suitable technique that removes a portion of substrate 402 without significantly impacting high polarity dielectric regions 440. In one embodiment, etched out region 420 is formed by first masking crystalline substrate 402 with a masking layer and then etching any exposed portions of crystalline substrate 402 with a dry etch or wet etch process. In an embodiment, etched out region 420 is formed by a dry plasma etch using $NF_3$, HBr, $SF_6/Cl$ or $Cl_2$ or a wet etch using $NH_4OH$ or tetramethylammonium hydroxide. In another embodiment, etched-out region 420 is formed with an in situ $Cl_2$ or HCl etch in a deposition chamber using 100-500 sccm $Cl_2$ or HCl in hydrogen carrier gas at a pressure in the range of 10-500 torr at a temperature in the range of 775° C.-900° C. for a duration in the range of 10 seconds-2 minutes.

Referring to FIGS. 4B-F, an amorphous region 408 may be formed in etched-out region 420 of crystalline substrate 402. In one embodiment, amorphous region 408 is comprised of hydrogenated amorphous silicon. In an embodiment, amorphous region 408 is comprised of hydrogenated amorphous silicon with a H:Si atomic ratio in the range of $1 \times 10^{-6}$-3:1. In another embodiment, amorphous region 408 is comprised of hydrogenated amorphous silicon with a H:Si atomic ratio of approximately 1:1. Amorphous region 408 may be deposited by any suitable selective deposition technique that enables formation on the surface of etched-out region 420 of low polarity crystalline substrate 402, but not on highly polar dielectric regions 440. In accordance with an embodiment of the present invention, amorphous region 408 is selectively formed by additively depositing thin amorphous layers via multiple deposition/etch cycles, as described in association with FIGS. 4B-E.

A pre-treatment of the low polarity surface may be required prior to the deposition process described below. For example, in accordance with an embodiment of the present invention, a fresh surface of the etched-out portion 420 of substrate 402 is prepared by removing any native oxide layers prior to the deposition process. In one embodiment, the surface of etched-out region 420 of substrate 402 is subjected to a wet clean step comprising aqueous hydrofluoric acid with a concentration in the range of 0.2-2% by volume for a duration in the range of 15 s-2 minutes at a temperature in the range of 10-50 degrees Celsius.

Figure 4B:
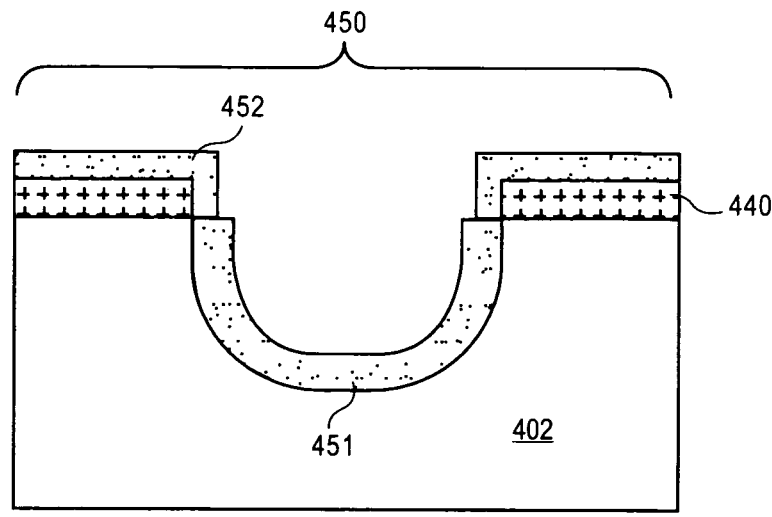

Referring to FIG. 4B, a thin amorphous layer 450 is deposited on highly polar dielectric regions 440 and in etched-out region 420. The thin amorphous layer is deposited selectively in that a thicker portion 451 is formed on the low polarity surface of etched-out region 420 as compared to a thinner portion 452 deposited on highly polar dielectric regions 440. In one embodiment, hydrogenated amorphous silicon is deposited on the surface of etched-out region 420 to a thickness in the range of 190-210 Angstroms and is deposited on highly polar dielectric regions 440 to a thickness in the range of 150-170 Angstroms, with a difference in thickness in the range of 40-60 Angstroms. Amorphous layer 450 may be deposited by any technique suitable to deposit a portion 451 on the surface of a low polarity etched-out region 420 that is thicker than a portion 452 deposited on the surfaces of highly polar dielectric regions 440. In one embodiment, amorphous layer 450 is deposited in a plasma-enhanced chemical vapor deposition (CVD) reaction chamber. In an embodiment, the deposition step is conducted in a plasma-enhanced CVD chamber using silicon- and hydrogen-based precursors. In a specific embodiment, the deposition process comprises flowing the gases $SiH_4$ and $H_2$ in a ratio in the range of 10-200: 10-200 sccm for a duration in the range of 5-20 seconds and with a process pressure in the range of 1-100 mTorr at temperature in the range of 75-125 degrees Celsius. In one embodiment, the deposition is carried out under a sustained plasma achieved with an RF source power in the range of 50-800 Watts.

Figure 4C:
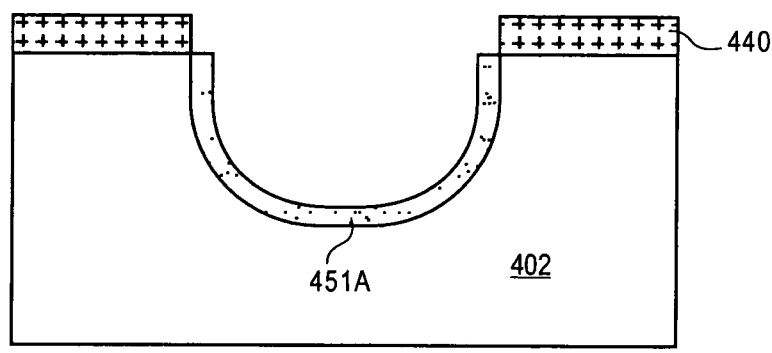

Amorphous layer 450 may then be subjected to a controlled etch process that removes all of portion 452 of amorphous layer 450, but allows some of portion 451 to remain to form a thinned portion 451A, as depicted in FIG. 4C. In one embodiment, amorphous layer 450 is thinned in the range of 150-175 Angstroms, thus removing portion 452 and thinning portion 451 to form thinned portion 451A with a thickness in the range of 15-60 Angstroms. In another embodiment, amorphous layer 450 is thinned by an amount in the range of 5-10 Angstroms greater than the thickness of the portions of amorphous region 450 that reside above highly polar dielectric regions 440.

The etch process may comprise a non-selective etch process that removes material in a uniform manner. For example, in accordance with an embodiment of the present invention, a reactive atomic hydrogen etchant produced within a plasma environment is used to uniformly remove a portion of a layer of hydrogenated amorphous silicon. In one embodiment, the etch step is conducted in a plasma-enhanced CVD chamber. In a specific embodiment, the etch process comprises flowing the gases $H_2$ and argon in a ratio in the range of 10-200:400-600 sccm for a duration in the range of 10-30 seconds and with a process pressure in the range of 1-100 mTorr at temperature in the range of 175-225 degrees Celsius. In one embodiment, the etch is carried out under an RF generated plasma in the range of 250-1000 Watts and an RF bias, which originates beneath the sample with respect to the plasma environment, in the range of 50-500 Watts. Both the deposition and etch cycles of the hydrogenated amorphous silicon film may be carried out in a plasma-enhanced CVD reaction chamber. In one embodiment, a deposition/etch cycle for growth of a hydrogenated amorphous silicon film on a substrate is conducted in the same plasma-enhanced CVD chamber without removing the substrate from the chamber in between the deposition and etch steps. In an embodiment, the volume of the plasma-enhanced CVD chamber is approximately 250 L. In another embodiment, the plasma-enhanced CVD chamber is a single-wafer deposition chamber with a volume of approximately 35 L.

Figure 4D:
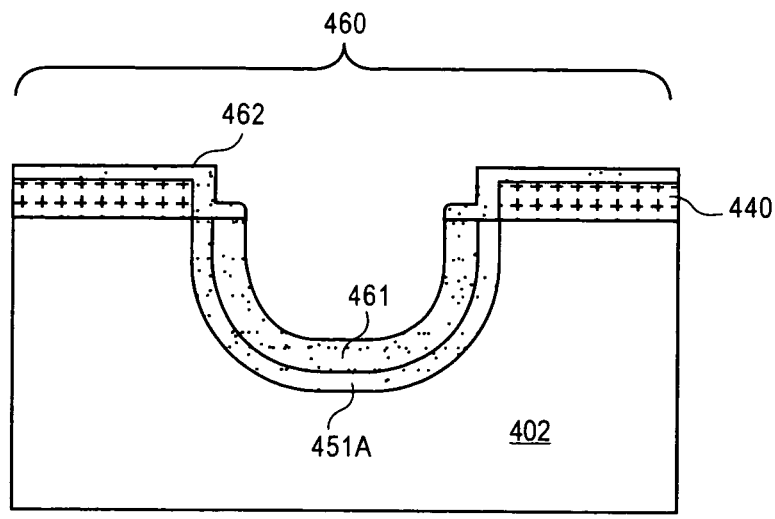

Referring to FIG. 4D, a second amorphous layer 460 is deposited on highly polar dielectric regions 440 and on portion 451A of thinned amorphous layer 450. Amorphous layer 460 is comprised of a thinner portion 462 on highly polar dielectric regions 440 and a thicker portion 461 on low polarity portion 451A. Similar to the deposition of amorphous layer 450, in accordance with an embodiment of the present invention, a layer of hydrogenated amorphous silicon is deposited on the surface of portion 451A to a thickness in the range of 190-210 Angstroms and is deposited on highly polar dielectric regions 440 to a thickness in the range of 150-170 Angstroms, with a difference in thickness in the range of 40-60 Angstroms.

Figure 4E:
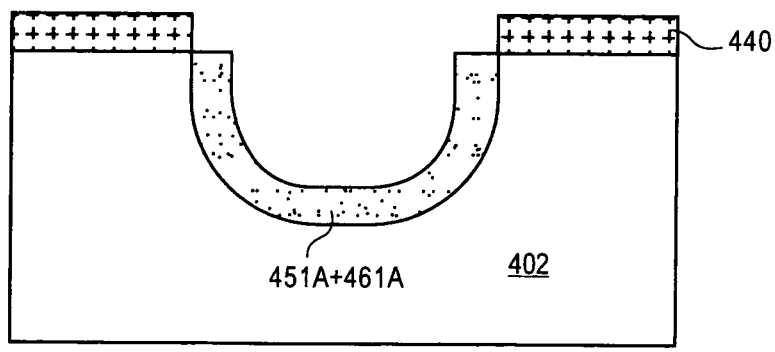
Figure 4F:
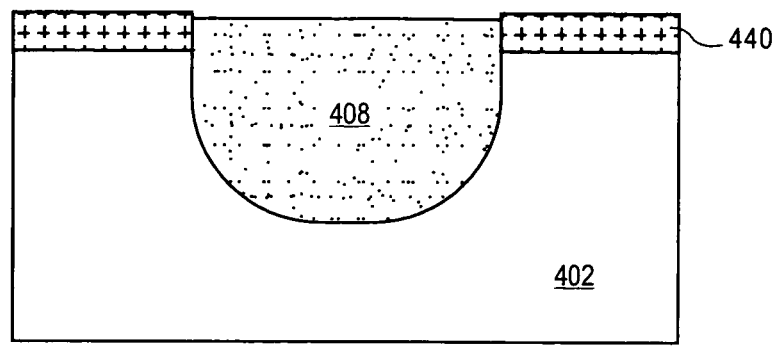

Subsequent to the second deposition step, an etch step like the one described in accordance with FIG. 4C may be carried out, as depicted in FIG. 4E. In one embodiment, amorphous layer 460 is thinned in the range of 150-175 Angstroms, thus removing portion 462 and thinning portion 461 to form thinned portion 461A with a thickness in the range of 15-60 Angstroms. In another embodiment, amorphous layer 460 is thinned by an amount in the range of 5-10 Angstroms greater than the thickness of the portions of amorphous region 460 that reside above highly polar dielectric regions 440. The total thickness of the deposited amorphous layer in etched-out region 420 may be calculated by adding the thicknesses of portions 451A and 461A, referring to FIG. 4E. Thus, in one embodiment, following two deposition/etch cycles, the total thickness of a layer of hydrogenated amorphous silicon on the surface of etched-out region 420 is in the range of 30-120 Angstroms. The deposition/etch cycles may be repeated until a final amorphous film 408 with a desired thickness is achieved, referring to FIG. 4F. In a specific embodiment of the present invention, approximately 20-30 deposition/etch cycles are carried out to form a layer of hydrogenated amorphous silicon 408 with a thickness in the range of 800-1000 Angstroms. In an alternative embodiment, a layer of hydrogenated amorphous silicon with a thickness in the range of 50-100 Angstroms is grown with each deposition/etch cycle.

Figure 4G:
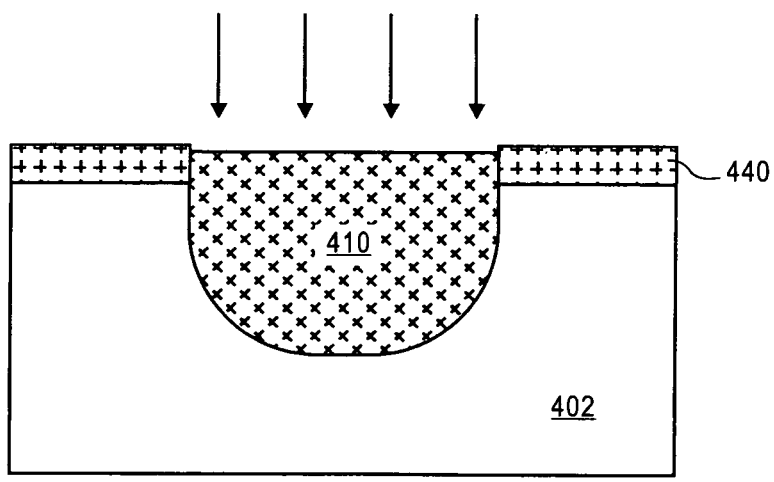

Referring to FIG. 4G, charge-carrier dopant and charge-neutral lattice-forming impurity atoms may subsequently be implanted into amorphous region 408 to form three-component amorphous region 410 in crystalline substrate 402. In one embodiment, amorphous region 408 is comprised of hydrogenated amorphous silicon and the charge-carrier dopant impurity atoms are phosphorus, arsenic, boron or indium atoms. In an embodiment, phosphorus dopant impurity atoms are implanted at a dose in the range of 3E15-1E16 atoms/cm$^2$ with an energy in the range of 3-20 keV. In one embodiment, amorphous region 408 is comprised of hydrogenated amorphous silicon and the charge-neutral lattice-forming impurity atoms are carbon or germanium atoms. In an embodiment, carbon lattice-forming impurity atoms are implanted at a dose in the range of 3E15-3E16 atoms/cm$^2$ with an energy in the range of 3-20 keV. In another embodiment, the concentration of lattice-forming carbon atoms in a silicon film (comprised of 97-99.5% Si atoms) is in the range of 0.5%-3% of the total film atomic composition and the concentration of phosphorus charge-carrier dopant impurity atoms is greater than 2E20 atoms/cm$^3$. In one embodiment, the concentration of phosphorus charge-carrier dopant impurity atoms in a hydrogenated amorphous silicon film is in the range of 2E19-2E20 atoms/cm$^3$ and the concentration of lattice-forming carbon atoms is about 1% of the total film atomic composition. In an alternative embodiment, charge-carrier dopant and charge-neutral lattice-forming impurity atoms are incorporated into amorphous region 408 via a solid-source diffusion process.

Figure 4H:
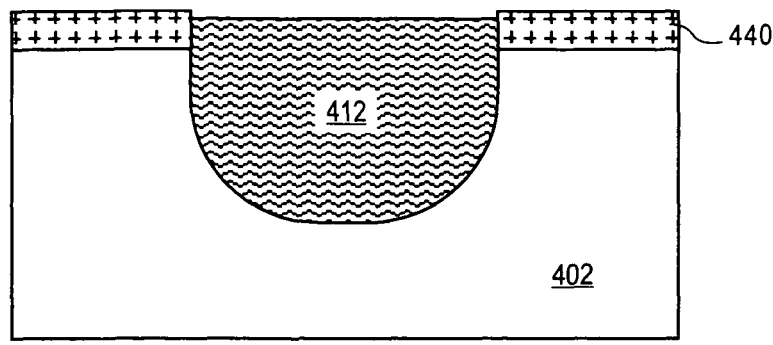

The three-component amorphous layer 410 with charge-carrier dopant and charge-neutral lattice-forming impurity atoms may then be heated to a temperature sufficient to surpass the activation threshold for conversion to a crystalline form. Referring to FIG. 4H, three-component amorphous film 410 is heated in order to provide the requisite activation energy to form conversion layer 412 within crystalline substrate 402. In accordance with an embodiment of the present invention, three-component amorphous layer 410 is activated to form conversion layer 412 by a thermal or flash anneal process or a laser irradiation process. In one embodiment, three-component amorphous layer 410 contains silicon, carbon and phosphorus atoms and is heated to a temperature in the range of 1000° C.-1300° C. for a duration of 10 microseconds-10 milliseconds. During the heating, any hydrogen atoms not at the surface of the three-component amorphous film 410 may be expelled. Thus, in accordance with an embodiment of the present invention, the hydrogen atoms in the bulk portion of a three-component hydrogenated amorphous silicon film 410 are expelled in the form of $H_2$.

Figure 4I:
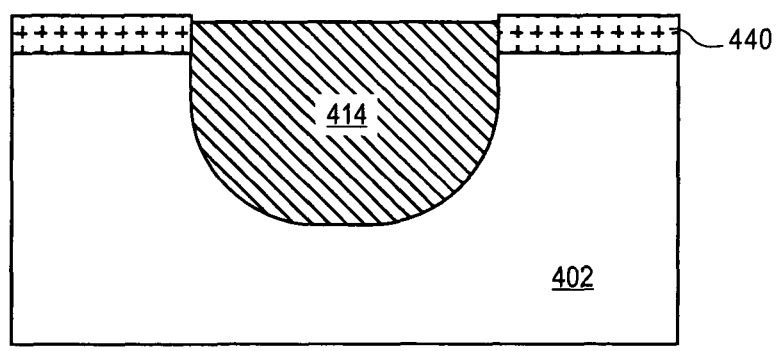

Referring to FIG. 4I, conversion layer 412 may then be cooled to room temperature to form a three-component epitaxial region 414 (the three components being: 1. the atoms of the original amorphous film, e.g. silicon, 2. the charge-carrier dopant impurity atoms, e.g. phosphorous, and 3. the charge-neutral lattice-forming impurity atoms, e.g. carbon). In one embodiment, three-component epitaxial region 414 has a lattice constant smaller than the lattice constant of crystalline substrate 402 and induces a tensile strain on crystalline substrate 402. In another embodiment, three-component epitaxial region 414 has a lattice constant larger than the lattice constant of crystalline substrate 402 and induces a compressive strain on crystalline substrate 402. In one embodiment, three-component crystalline region is comprised of 97-99.5% silicon atoms, carbon lattice-forming atoms in a concentration range of 0.5%-3% of the total film atomic composition and phosphorus charge-carrier dopant impurities with a concentration greater than 2E20 atoms/cm$^3$. In one embodiment, the top surface of three-component epitaxial region 414 is raised above the top surface of crystalline substrate 402, as depicted in FIG. 4I.

A three-component epitaxial film for use in the fabrication of a semiconductor device may be formed by a multiple deposition/etch cycle sequence, followed by charge-carrier dopant and charge-neutral lattice-forming impurity atom implant steps and, finally, a kinetically-driven crystallization process. In one embodiment, the semiconductor device is a MOS-FET, a bipolar transistor, a memory transistor or a micro-electronic machine (MEM). In another embodiment, the semiconductor device is a planar device or a non-planar device, such as a tri-gate or double-gate transistor. For illustrative purposes, the fabrication of an NMOS-FET device incorporating a strain-inducing three-component epitaxial film formed by a multiple deposition/etch cycle sequence involving hydrogenated amorphous silicon is described below, in accordance with one embodiment of the present invention.

Figure 5A:
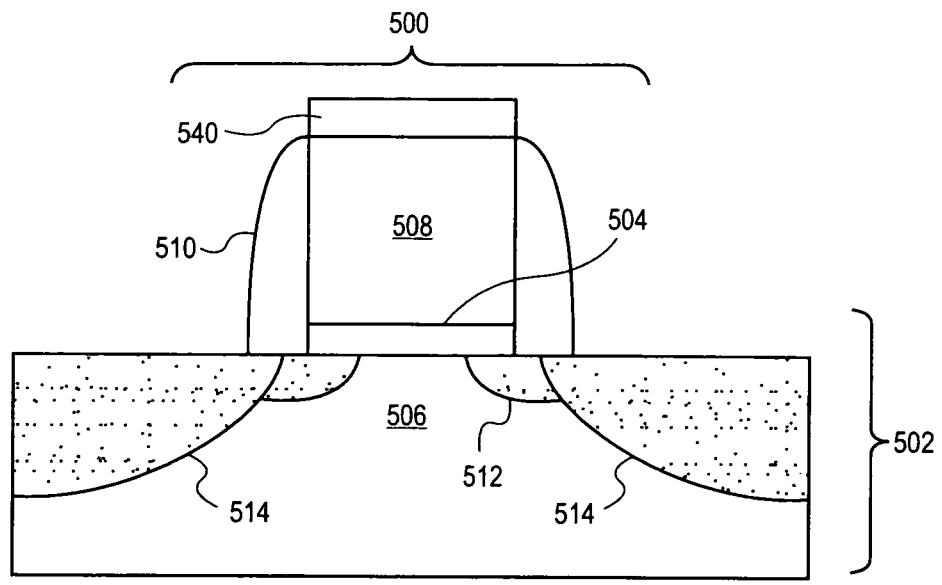
FIGS. 5A-F illustrate cross-sectional views representing the formation of strain-inducing source/drain regions in an NMOS-FET, in accordance with an embodiment of the present invention.

FIGS. 5A-F illustrate a process flow for forming strain-inducing source/drain regions in an NMOS-FET, in accordance with an embodiment of the present invention. Referring to FIG. 5A, a non-strained NMOS-FET 500 is first formed. Non-strained NMOS-FET 500 is comprised of a channel region 506 in a crystalline substrate 502 (i.e. the "host" material). In one embodiment, crystalline substrate 502 is a crystalline silicon substrate, a doped crystalline silicon substrate, or an epitaxial silicon layer grown atop a distinct boron-doped crystalline silicon substrate. In another embodiment, crystalline substrate 502 is comprised of germanium or a III-V material such as but not limited to gallium nitride, gallium phosphide, gallium arsenide, indium phosphide or indium antimonide. The surface of crystalline substrate 502 may be a low polarity surface. A low polarity surface comprises atomic interactions of substantially similar polarity. For example, in one embodiment, as calculated using the difference of Pauling's values for electronegativity for each atom type, the polarity of the surface atomic interactions is in the range of 0-0.5 (for example: where H is 2.1 and Si or Ge are 1.8, an Si—H or Ge—H bond has a value of ~0.3 and Si—Si, Ge—Ge or Ge—Si bonds have a value of ~0; or where an In—Sb bond has a value of ~0.25).

A gate dielectric layer 504 may be formed above channel region 506. In one embodiment, gate dielectric layer 504 is formed by a thermal oxidation process and is comprised of silicon dioxide or silicon oxy-nitride. In another embodiment, gate dielectric layer 504 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide.

A gate electrode 508 may be formed above gate dielectric layer 504. Gate electrode 508 may be formed by a subtractive etching process scheme or by a replacement gate process scheme. In one embodiment, gate electrode 508 is comprised of a polycrystalline silicon gate electrode, wherein the charge-carrier dopant impurities are implanted during fabrication of the tip and source/drain regions, described below. In another embodiment, gate electrode 508 is comprised of a metal layer such as but not limited to metal nitrides, metal carbides, hafnium, zirconium, titanium, tantalum, aluminum, ruthenium, palladium, platinum, cobalt, nickel or conductive metal oxides, e.g. ruthenium oxide.

A highly polar dielectric gate electrode protection layer 540 is formed above gate electrode 508, as depicted in FIG. 5A. The highly polar dielectric gate electrode protection layer 540 may be formed from any material suitable to provide a highly polar dielectric surface. In an embodiment, highly polar dielectric gate electrode protection layer 540 is comprised of a dielectric material with surface atomic interactions having a difference of Pauling's values greater than 1. In one embodiment, highly polar dielectric gate electrode protection layer 540 is comprised of silicon dioxide (where Pauling's value for electronegativity for Si is 1.8 and for O is 3.5, and thus an Si—O bond has a value of ~1.7), silicon nitride (where Pauling's value for electronegativity for Si is 1.8 and for N is 3, and thus an Si—N bond has a value of ~1.2), silicon oxy-nitride or carbon-doped silicon nitride.

A tip extension 512 may be formed by implanting charge-carrier dopant impurity atoms into substrate 502. Gate electrode 508 may act to mask a portion of substrate 502 to form self-aligned tip extensions 512. In one embodiment, boron, arsenic, phosphorus, indium or a combination thereof is implanted into substrate 502 to form tip extension 512.

Gate dielectric layer 504 and gate electrode 508 may be isolated by a pair of highly polar dielectric gate isolation spacers 510. The pair of highly polar dielectric gate isolation spacers 510 may be formed from any material suitable to provide a highly polar dielectric surface. In an embodiment, the pair of highly polar dielectric gate isolation spacers 510 is comprised of a dielectric material with surface atomic interactions having a difference of Pauling's values greater than 1. In one embodiment, the pair of highly polar dielectric gate isolation spacers 510 is comprised of silicon dioxide (where Pauling's value for electronegativity for Si is 1.8 and for O is 3.5, and thus an Si—O bond has a value of ~1.7), silicon nitride (where Pauling's value for electronegativity for Si is 1.8 and for N is 3, and thus an Si—N bond has a value of ~1.2), silicon oxy-nitride or carbon-doped silicon nitride. In another embodiment, the thickness of the highly polar dielectric layer is selected to determine the final width of the pair of highly polar dielectric gate isolation spacers 510. In one embodiment, the pair of highly polar dielectric gate isolation spacers 510 forms a hermetic seal with gate electrode 508 and the top surface of substrate 502 in order to encapsulate gate dielectric layer 504.

A sacrificial source/drain region 514 may be formed, but is not required, by implanting charge-carrier dopant impurity atoms into substrate 502. Thus, source/drain region 514 may be formed from the same material as channel region 506. Therefore, the lattice mismatch between source/drain region 514 and channel region 506 may be negligible, resulting in effectively no strain induced on channel region 506. The pair of highly polar dielectric gate isolation spacers 510 and gate electrode 508 may act to shield a portion of substrate 502 during the implant step to form self-aligned sacrificial source/drain regions 514. In effect, the thickness of the pair of highly polar dielectric gate isolation spacers 510 may play a role in dictating the dimensions of sacrificial source/drain region 514. In one embodiment, boron, arsenic, phosphorus, indium or a combination thereof is implanted into substrate 502 to form sacrificial source/drain regions 514.

Figure 5B:
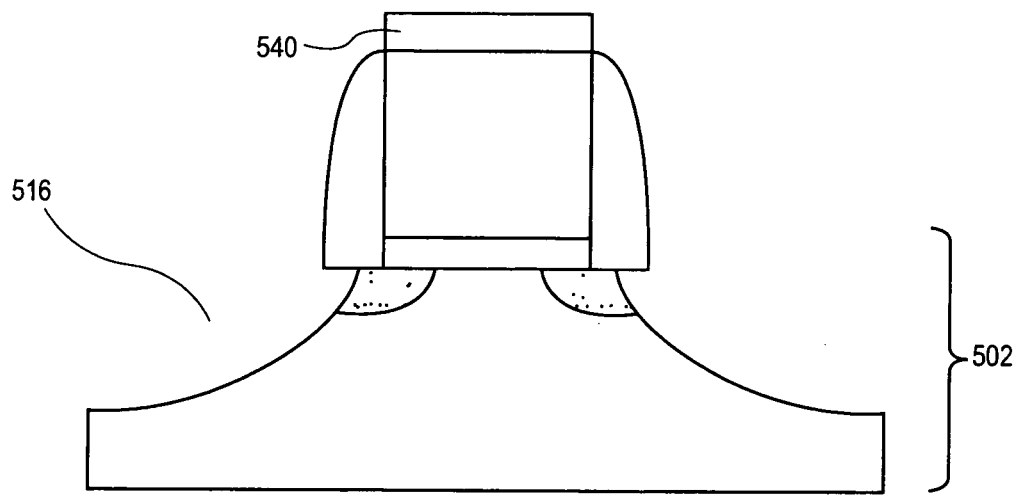

Referring to FIG. 5B, portions of substrate 502, including source/drain regions 514, may be removed to form recessed region 516 in substrate 502. Recessed region 516 may be formed by any suitable technique that removes a portion of substrate 502 without detrimentally impacting other semiconductor features that are present, such as a dry etch or a wet etch process. In one embodiment, recessed region 516 is formed by a dry plasma etch using $NF_3$, HBr, $SF_6/Cl$ or $Cl_2$ or a wet etch using $NH_4OH$ or tetramethylammonium hydroxide. In another embodiment, etched-out region 420 is formed with an in situ $Cl_2$ or HCl etch in a deposition chamber using 100-500 sccm $Cl_2$ or HCl in hydrogen carrier gas at a pressure in the range of 10-500 torr at a temperature in the range of 775° C.-900° C. for a duration in the range of 10 seconds-2 minutes. In one embodiment, highly polar dielectric gate electrode protection layer 540 protects gate electrode 508 during the formation of recessed region 516. In another embodiment, recessed region 516 is formed to a depth sufficient to remove the charge-carrier dopant impurity atoms implanted to form sacrificial source/drain region 514, as depicted in FIG. 5B. In one embodiment, recessed region 516 is laterally recessed to further remove a substantial portion of tip extension 512.

Figure 5C:
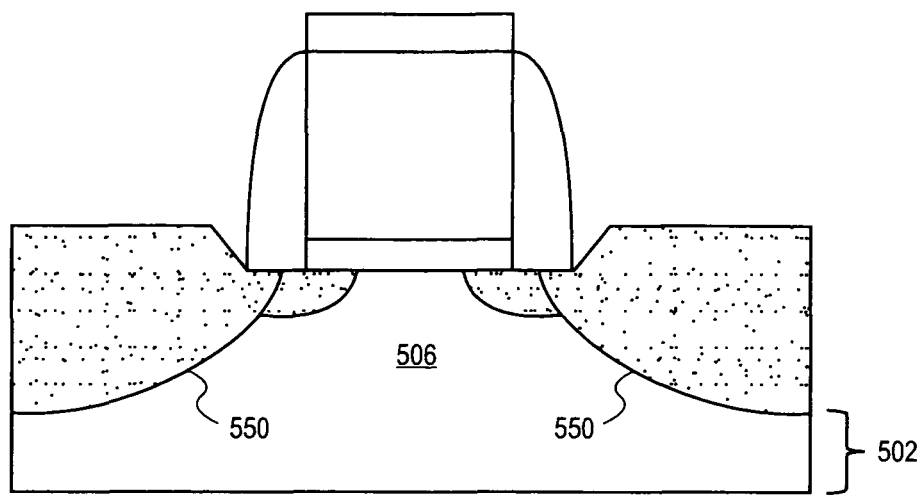

Referring to FIG. 5C, amorphous region 550 may be formed selectively in recessed region 516. In one embodiment, amorphous region 550 is a hydrogenated amorphous silicon region. Amorphous region 550 may be deposited by any suitable selective deposition technique that enables formation on low polarity crystalline substrate 502 but not on highly polar dielectric gate electrode protection layer 540 or the pair of highly polar dielectric gate isolation spacers 510. In accordance with an embodiment of the present invention, amorphous region 550 is selectively formed by depositing thin hydrogenated amorphous silicon layers by multiple deposition/etch cycles, as discussed above in association with FIGS. 4B-E. In a specific embodiment, approximately 20-30 deposition/etch cycles are carried out to form hydrogenated amorphous silicon region 550 with a thickness in the range of 800-1000 Angstroms. In another embodiment, the top surface of amorphous region 550 is raised above the top surface of substrate 502, and hence above the top surface of channel region 506, as depicted in FIG. 5C.

Figure 5D:
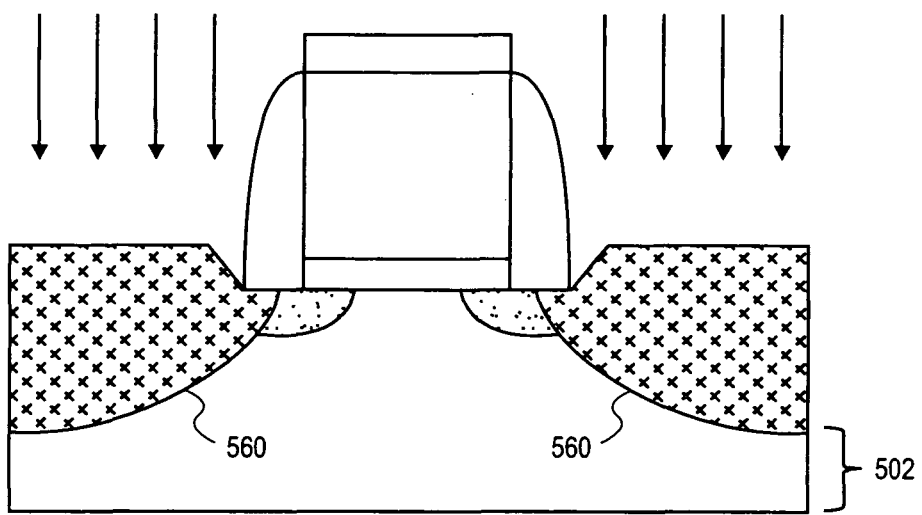

Referring to FIG. 5D, charge-carrier dopant and charge-neutral lattice-forming impurity atoms are subsequently implanted into amorphous region 550 to form three-component amorphous region 560 in crystalline substrate 502. In one embodiment, amorphous region 550 is comprised of hydrogenated amorphous silicon and the charge-carrier dopant impurity atoms are phosphorus, arsenic, boron or indium atoms. In another embodiment, phosphorus dopant impurity atoms are implanted at a dose in the range of 3E15-3E16 atoms/$cm^2$ with an energy in the range of 3-20 keV. In one embodiment, amorphous region 550 is comprised of hydrogenated amorphous silicon and the charge-neutral lattice-forming impurity atoms are carbon atoms. In an embodiment, carbon lattice-forming impurity atoms are implanted at a dose in the range of 3E15-3E16 atoms/$cm^2$ with an energy in the range of 3-20 keV. In another embodiment, the concentration of lattice-forming carbon atoms in a silicon film (comprised of 97-99.5% Si atoms) is in the range of 0.5%-3% of the total film atomic composition and the concentration of phosphorus charge-carrier dopant impurity atoms is greater than 2E20 atoms/$cm^3$. In one embodiment, the concentration of phosphorus charge-carrier dopant impurity atoms in a hydrogenated amorphous silicon film is in the range of 2E19-2E20 atoms/$cm^3$ and the concentration of lattice-forming carbon atoms is about 1% of the total film atomic composition. In an alternative embodiment, charge-carrier dopant and charge-neutral lattice-forming impurity atoms are incorporated into amorphous region 550 via a solid-source diffusion process.

Figure 5E:
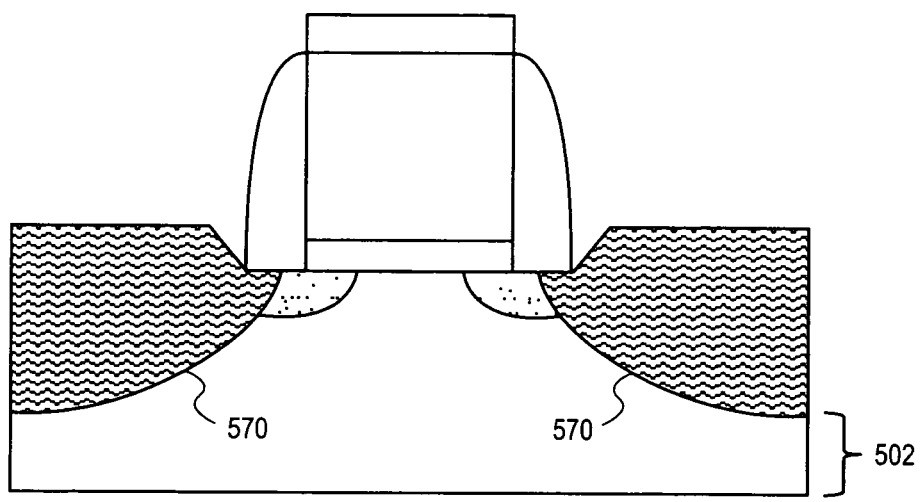

Three-component amorphous region 560 may then be heated to a temperature sufficient to surpass the activation threshold for conversion to a crystalline form. Referring to FIG. 5E, three-component amorphous region 560 is heated in order to provide the requisite activation energy to form conversion region 570 within crystalline substrate 502. In accordance with an embodiment of the present invention, three-component amorphous region 560 is activated to form conversion region 570 by a thermal or flash anneal process or a laser irradiation process. In one embodiment, three-component amorphous region 560 contains silicon, carbon and phosphorus atoms and is heated to a temperature in the range of 1000° C.-1300° C. for a duration of 10 microseconds-10 milliseconds. In another embodiment, excessive phosphorus diffusion is favorably suppressed by using such a short anneal time. During the heating, any hydrogen atoms not at the surface of the three-component amorphous region 560 may be expelled. Thus, in accordance with an embodiment of the present invention, the hydrogen atoms in the bulk portion of a three-component hydrogenated amorphous silicon region 560 are expelled in the form of $H_2$.

Figure 5F:
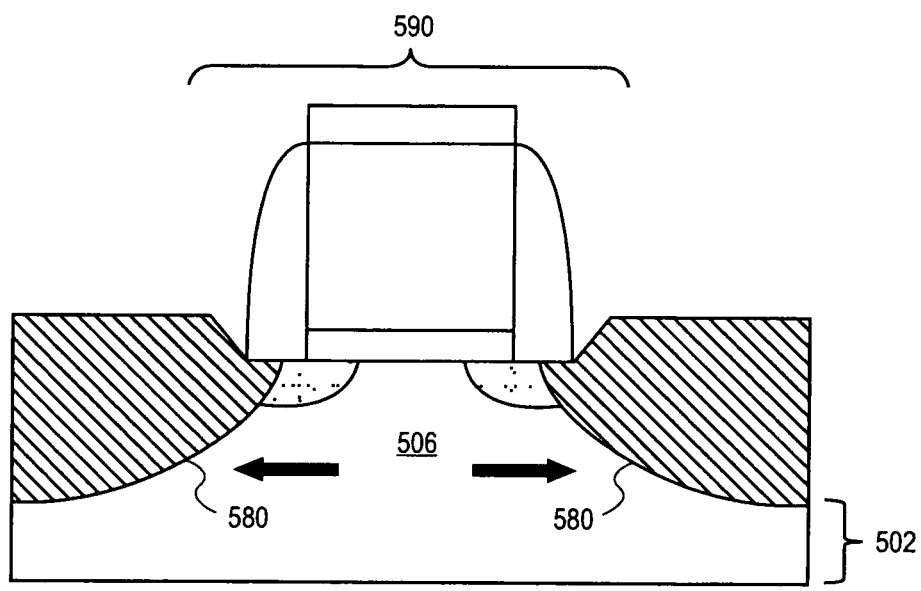

Referring to FIG. 5F, conversion region 570 is cooled to room temperature to form a three-component epitaxial region 580. In one embodiment, three-component epitaxial region 580 has a lattice constant smaller than the lattice constant of substrate 502, and hence channel region 506, and induces a tensile strain on channel region 506. In one embodiment, three-component crystalline region is comprised of 97-99.5% silicon atoms, carbon lattice-substitution atoms in a concentration range of 0.5%-3% of the total film atomic composition and phosphorus charge-carrier dopant impurity atoms with a concentration greater than 2E20 atoms/$cm^3$. In one embodiment, the top surface of three-component crystalline region 580 is raised above the top surface of crystalline substrate 502, as depicted in FIG. 5F.

Three-component epitaxial region 580 may function as a source/drain region and thus NMOS-FET 590 in FIG. 5F may comprise strain-inducing source/drain regions. Therefore, a uniaxial tensile strain, depicted by the arrows in FIG. 5F, may be rendered on channel region 506 in NMOS-FET 590, which can enhance electron mobility in the device. In one embodiment, the top surface of three-component epitaxial region 580 is raised above the top surface of substrate 502, and hence above the top surface of channel region 506, as depicted in FIG. 5F. In another embodiment, three-component epitaxial region 580 also functions as a tip extension. NMOS-FET 590 may subsequently be incorporated into an integrated circuit by conventional process steps, as known in the art.

The present invention is not limited to the formation of NMOS-FET devices with strain-inducing source/drain regions and/or tip extensions. In accordance with another embodiment of the present invention, a PMOS-FET comprising strain-inducing source/drain regions may be fabricated in a manner similar to that illustrated in FIGS. 5A-F. In one embodiment, a three-component epitaxial region has a lattice constant larger than the lattice constant of the channel region and thus induces a compressive strain on the channel region. In another embodiment, a three-component epitaxial region is formed from a hydrogenated amorphous silicon layer implanted with boron charge-carrier dopant and germanium charge-neutral lattice-forming impurity atoms to provide an epitaxial silicon/germanium film with a germanium atomic concentration in the range of 10%-30% of the total film atomic composition and boron charge-carrier dopant impurity atoms with a concentration in the range of 2E19 atoms/$cm^3$-2E21 atoms/$cm^3$. In an alternative embodiment, a strain-inducing epitaxial region is formed from a III-V material with charge-carrier dopant impurity atoms selected from the group consisting of carbon, silicon, germanium, oxygen, sulfur, selenium or tellurium.

Thus, a method to form a strain-inducing epitaxial film has been disclosed. In an embodiment, the strain-inducing epitaxial film is a three-component epitaxial film comprising atoms from an amorphous film, charge-neutral lattice-substitution atoms and charge-carrier dopant impurity atoms. In one embodiment, the strain-inducing epitaxial film is formed by a multiple deposition/etch cycle sequence involving hydrogenated amorphous silicon, followed by charge carrier dopant and charge-neutral lattice-forming impurity atom implant steps and, finally, a kinetically-driven crystallization process.

What is claimed is:

1. A method of forming a semiconductor structure comprising:
   forming a substrate comprising a highly polar dielectric region and a low polarity crystalline region;
   depositing a hydrogenated amorphous-only silicon layer above said highly polar dielectric region and above said low polarity crystalline region;
   etching said hydrogenated amorphous-only silicon layer to totally remove the portion of said hydrogenated amorphous-only silicon layer above said highly polar dielectric region and to thin, but not totally remove, the portion of said hydrogenated amorphous-only silicon layer above said low polarity crystalline region; and
   repeating the depositing and etching steps to provide a hydrogenated amorphous-only silicon film of a desired thickness above said low polarity crystalline region, but not above said high polarity dielectric region.

2. The method of claim 1, wherein depositing said hydrogenated amorphous-only silicon layer comprises depositing a thinner layer above said highly polar dielectric region than above said low polarity crystalline region.

3. The method of claim 2, wherein said hydrogenated amorphous-only silicon layer is deposited to a thickness in the range of 150-170 Angstroms above said highly polar dielectric region and is deposited to a thickness in the range of 190-210 Angstroms above said low polarity crystalline region.

4. The method of claim 1, wherein etching said hydrogenated amorphous-only silicon layer comprises a reactive atomic hydrogen etch process.

5. The method of claim 4, wherein etching said hydrogenated amorphous-only silicon layer removes 150-175 Angstroms of said hydrogenated amorphous-only silicon layer.

6. The method of claim 1, wherein the depositing and etching steps are repeated 20-30 times to provide a hydrogenated amorphous-only silicon film with a thickness in the range of 800-1000 Angstroms above said low polarity crystalline region.

7. The method of claim 1, wherein the depositing is carried out in a plasma-enhanced CVD reaction chamber and, without removing said substrate from said plasma-enhanced CVD reaction chamber, the etching is carried out in said plasma-enhanced CVD reaction chamber.

8. A method of forming a semiconductor structure comprising:
   forming a substrate comprising a highly polar dielectric region and a low polarity crystalline region;

depositing a hydrogenated amorphous-only silicon layer above said highly polar dielectric region and above said low polarity crystalline region;

etching said hydrogenated amorphous-only silicon layer to totally remove the portion of said hydrogenated amorphous-only silicon layer above said highly polar dielectric region and to thin, but not totally remove, the portion of said hydrogenated amorphous-only silicon layer above said low polarity crystalline region;

repeating the depositing and etching steps until a hydrogenated amorphous-only silicon film of a desired thickness is formed above said crystalline region;

implanting charge-carrier dopant impurity atoms and charge-neutral lattice-forming impurity atoms into said hydrogenated amorphous-only silicon film to form a three-component amorphous-only film; and crystallizing said three-component amorphous-only film with a kinetically-driven crystallization process to form a three-component epitaxial film.

9. The method of claim 8, wherein the charge-neutral lattice-forming impurity atoms are smaller than the charge-carrier dopant impurity atoms.

10. The method of claim 8, wherein depositing said hydrogenated amorphous-only silicon layer comprises depositing a thinner layer above said highly polar dielectric region than above said low polarity crystalline region.

11. The method of claim 10, wherein said hydrogenated amorphous-only silicon layer is deposited to a thickness in the range of 150-170 Angstroms above said highly polar dielectric region and is deposited to a thickness in the range of 190-210 Angstroms above said low polarity crystalline region.

12. The method of claim 8, wherein etching said hydrogenated amorphous-only silicon layer comprises a reactive atomic hydrogen etch process.

13. The method of claim 12, wherein etching said hydrogenated amorphous-only silicon layer removes 150-175 Angstroms of said hydrogenated amorphous-only silicon layer.

14. The method of claim 8, wherein the depositing and etching steps are repeated 20-30 times to provide a hydrogenated amorphous-only silicon film with a thickness in the range of 800-1000 Angstroms above said low polarity crystalline region.

15. The method of claim 8, wherein the depositing is carried out in a plasma-enhanced CVD reaction chamber and, without removing said substrate from said plasma-enhanced CVD reaction chamber, the etching is carried out in said plasma-enhanced CVD reaction chamber.

16. The method of claim 9 wherein said three-component epitaxial film is comprised of 97-99.5% silicon atoms, carbon lattice-substitution atoms with a concentration in the range of 0.5% - 3% of the total film atomic composition and phosphorus charge-carrier dopant impurity atoms with a concentration greater than 2E20 atoms/cm3.

* * * * *